United States Patent
Haas

(10) Patent No.: US 9,689,910 B2
(45) Date of Patent: Jun. 27, 2017

(54) DETECTING FAULTS IN A TWO-WIRE POWER LINE

(71) Applicant: Wabtec Holding Corp., Wilmerding, PA (US)

(72) Inventor: Carl L. Haas, Walkersville, MD (US)

(73) Assignee: Wabtec Holding Corp., Wilmerding, PA (US)

( * ) Notice: Subject to any disclaimer, the term of this patent is extended or adjusted under 35 U.S.C. 154(b) by 353 days.

(21) Appl. No.: 13/913,661

(22) Filed: Jun. 10, 2013

(65) Prior Publication Data

US 2014/0361783 A1 Dec. 11, 2014

(51) Int. Cl.
*G01R 31/14* (2006.01)
*G01R 31/02* (2006.01)
*G01R 31/00* (2006.01)

(52) U.S. Cl.
CPC .......... *G01R 31/025* (2013.01); *G01R 31/008* (2013.01)

(58) Field of Classification Search
CPC  G01R 31/025; G01R 31/021; G01R 31/1272; G01R 27/18; B60L 3/0069
See application file for complete search history.

(56) References Cited

U.S. PATENT DOCUMENTS

| | | | |
|---|---|---|---|
| 3,670,240 A * | 6/1972 | Maranchak | G01R 31/11 324/535 |
| 3,757,169 A * | 9/1973 | Beresnikow | G01R 27/18 324/509 |
| 4,203,142 A | 5/1980 | Lee | |
| 4,298,864 A * | 11/1981 | Mahnke | G01R 19/16571 340/649 |
| 4,417,202 A | 11/1983 | Pascoe | |
| 4,608,619 A | 8/1986 | Bomer et al. | |
| 4,864,242 A * | 9/1989 | Hurley | G01R 31/346 324/510 |
| 5,202,812 A * | 4/1993 | Shinoda | G01R 15/24 361/107 |
| 5,386,183 A | 1/1995 | Cronvich et al. | |
| 5,416,692 A | 5/1995 | Shimizu et al. | |
| 5,528,444 A | 6/1996 | Cooke et al. | |
| 5,528,445 A | 6/1996 | Cooke et al. | |
| 5,946,174 A * | 8/1999 | Kaiser | G01R 31/025 361/47 |
| 6,097,580 A | 8/2000 | Zaretsky | |
| 6,127,747 A * | 10/2000 | Halvorson | H02H 3/17 303/122.04 |
| 6,163,089 A | 12/2000 | Kull | |
| 6,189,980 B1 | 2/2001 | Kull | |
| 6,217,126 B1 * | 4/2001 | Kull | B60T 13/665 303/15 |

(Continued)

FOREIGN PATENT DOCUMENTS

EP 1457785 A2 9/2004
JP 200557905 A 3/2005

*Primary Examiner* — Tung X Nguyen
*Assistant Examiner* — Dominic Hawkins
(74) *Attorney, Agent, or Firm* — The Webb Law Firm

(57) ABSTRACT

An apparatus and method for detecting faults in a two-wire electric power line isolated from ground includes substantially identical high impedance voltage dividers connected between each of the two wires of the power line and ground, circuits for carrying the output voltages from each voltage divider, a circuit for comparing the output voltages, and outputting a fault signal indicative of a ground fault.

20 Claims, 2 Drawing Sheets

(56) References Cited

U.S. PATENT DOCUMENTS

| | | |
|---|---|---|
| 6,229,452 B1 | 5/2001 | Kull |
| 6,243,628 B1 | 6/2001 | Bliley et al. |
| 6,421,618 B1 | 7/2002 | Kliman et al. |
| 6,626,506 B2 | 9/2003 | Kettle, Jr. |
| 6,676,229 B1 | 1/2004 | Marra et al. |
| 6,839,664 B1 | 1/2005 | Kull |
| 6,856,137 B2 | 2/2005 | Roden et al. |
| 6,952,103 B2 * | 10/2005 | Herb ............... G01R 27/18 324/500 |
| 7,248,057 B1 | 7/2007 | Kumar |
| 7,344,202 B2 | 3/2008 | Linebach et al. |
| 7,498,820 B2 | 3/2009 | Kumar |
| 7,498,821 B2 | 3/2009 | Wells |
| 7,501,830 B2 | 3/2009 | Kumar |
| 7,562,945 B2 | 7/2009 | Linebach et al. |
| 8,149,551 B2 | 4/2012 | Vedula et al. |
| 8,189,306 B2 | 5/2012 | Jacobson et al. |
| 2003/0137309 A1 * | 7/2003 | Itimura ............... G01R 31/025 324/536 |
| 2004/0088631 A1 * | 5/2004 | Blank ............... H04L 41/0677 714/746 |
| 2004/0245994 A1 | 12/2004 | Schlapp et al. |
| 2005/0036249 A1 * | 2/2005 | Harvey ............... G01R 31/025 361/42 |
| 2005/0190828 A1 * | 9/2005 | Hsu ............... H04B 3/46 375/224 |
| 2007/0059986 A1 * | 3/2007 | Rockwell ............... G01R 19/2513 439/638 |
| 2007/0285057 A1 | 12/2007 | Yano |
| 2008/0007416 A1 * | 1/2008 | Cern ............... G01R 23/06 340/664 |
| 2008/0231286 A1 * | 9/2008 | Tsunekazu ............... G01R 31/024 324/509 |
| 2010/0271044 A1 * | 10/2010 | Keret ............... G01R 31/085 324/544 |
| 2012/0043967 A1 * | 2/2012 | Miura ............... B60L 3/0069 324/426 |
| 2012/0147507 A1 | 6/2012 | Rivers, Jr. et al. |
| 2012/0280697 A1 * | 11/2012 | Morimoto ............ B60L 3/0069 324/606 |
| 2012/0299598 A1 * | 11/2012 | Alley ............... G01R 31/025 324/509 |
| 2013/0222163 A1 * | 8/2013 | Darthenay ............ H03M 1/1245 341/122 |
| 2013/0275026 A1 * | 10/2013 | Methil-Sudhakaran ............ F02M 65/003 701/103 |

\* cited by examiner

DETECTING FAULTS IN A TWO-WIRE POWER LINE

BACKGROUND OF THE INVENTION

Field of the Invention

The present invention relates to methods and apparatus for detecting faults in a two-wire power line. In particular, the present invention relates to detecting ground faults or leakage current in the two-wire train line cable on Electronically Controlled Pneumatic (ECP) equipped trains.

Description of Related Art

In the past, the railroads have typically operated trains having only a single air line extending the length of the train. This air line was used for both providing a source of compressed air and a medium for propagating braking signals. While this system has been used extensively in the past, it has several drawbacks. Signaling via air pressure messages propagating through the air line has a limited propagation speed.

In recent years, the Association of American Railroads (AAR) and individual railroads have investigated using ECP brake systems. These systems typically use electric messages on an electrical power line extending the length of the train to activate the brakes on each car because of the almost instantaneous propagation of the electric signal. Whereas, in a pneumatic pipe with numerous couplings, turns, and other restrictions, the pneumatic signal propagation is limited, the ECP brake system allows for nearly instantaneous activation of the railcar brakes along the entire length of the train.

ECP brake systems for railroads utilize a two-wire cable that carries both digital communication signals and system power. The system power used is presently 230 Volts DC, but other AC or DC voltages could be used. During start-up, the system is often powered to 24 Volts DC.

The North American Railroad Industry, led by the AAR, has developed standards for ECP brakes. These standards include an electric two-conductor train line cable, which operates at 230 VDC, for providing power and communications to and from the ECP units on each car.

The two-wire power system is floating relative to earth ground. Typically, this two-wire power system is powered from one or more locomotive batteries through a DC to DC converter. The design of the system is such that these two conductors are isolated from ground.

U.S. Pat. No. 6,127,747 entitled "Method and Apparatus for Detecting Leakage Current on a Two Wire DC or AC Power Line" and U.S. Pat. No. 6,217,126 entitled "Railway Emulation Brake" both relate to ECP brake systems and are assigned to the same assignee as this application.

SUMMARY OF THE INVENTION

Briefly, according to this invention, there is provided apparatus for detecting faults in a two-wire electric power line isolated from ground comprising substantially identical high impedance voltage dividers connected between each of the two wires of the power line and ground, circuits for carrying the output voltages from each voltage divider, a circuit for comparing the output voltages, and outputting a fault signal indicative of a ground fault, for example, when the output voltages are not approximately equal and opposite or when the absolute values of the output voltages are not within a predetermined range.

Briefly, according to this invention, there is provided apparatus for detecting faults in a two-wire electric power line isolated from ground comprising substantially identical high impedance voltage dividers connected between each of the two wires of the power line and ground, an analog to digital converter for converting the divided analog voltages from each voltage divider to digital signals, a logic circuit for comparing the digital signals, and outputting a fault signal when the digital signals are not approximately equal and opposite or when the absolute values of the digital signals are not within a predetermined range.

Briefly, according to this invention, there is provided a method for detecting faults in a two-wire electric power line isolated from ground comprising the steps of connecting each of the two wires of the power line, respectively, to identical high impedance voltage dividers and ground, outputting voltages from each voltage divider, comparing the output voltages, and generating a fault signal, for example, when the absolute values of the output voltages are not within a predetermined range.

Briefly, according to this invention, there is provided a method for detecting faults in a two-wire electric power line isolated from ground comprising the steps of connecting each of the two wires of the power line, respectively, to identical high impedance voltage dividers and ground, converting the divided analog voltages from each voltage dividers to digital signals, comparing the digital signals, and generating a fault signal when the digital signals are not approximately equal and opposite or when the absolute values of the digital signals are not within a predetermined range.

In preferred embodiments, the apparatus and method for detecting faults according to this invention provides the input impedance of the voltage dividers exceeding one Megaohm, the voltage dividers provide at least a 50:1 reduction between input and output voltages and the output voltages of the voltage dividers are conditioned and buffered by op amps.

In preferred embodiments, the apparatus and method for detecting faults according to this invention provides voltage dividers each comprised of two resistors with the higher value and lower value resistors being respectively matched in value. The analog to digital converter has two selectable inputs, and the analog to digital converter has an input range of minus ten to plus ten volts.

According to further preferred embodiments of the apparatus and method according to this invention for detecting faults, the logic circuit identifies on which of the two wires of the power cable the fault occurs by identifying the input with less voltage magnitude.

According to yet further preferred embodiments of the apparatus and method according to this invention for detecting faults, the logic circuit comprises a microcontroller programmed to determine if the absolute values of the digital signals input form the analog to digital converter are within a preselected range or within a preselected tolerance of the other and the logic circuit calculates the approximate impedance of a single fault condition using the following formula: $R(fault)=[V(ratio)*R(input)]/[1-V(ratio)]$, where $R(fault)$ is the impedance of the fault, $V(ratio)$ is the smaller magnitude voltage divided by the larger, and $R(input)$ is the input impedance of each input.

BRIEF DESCRIPTION OF THE DRAWINGS

Further features and other objects and advantages of this invention will become clear from the following detailed description made with reference to the drawings.

DESCRIPTION OF THE PREFERRED EMBODIMENTS

Figure 1:
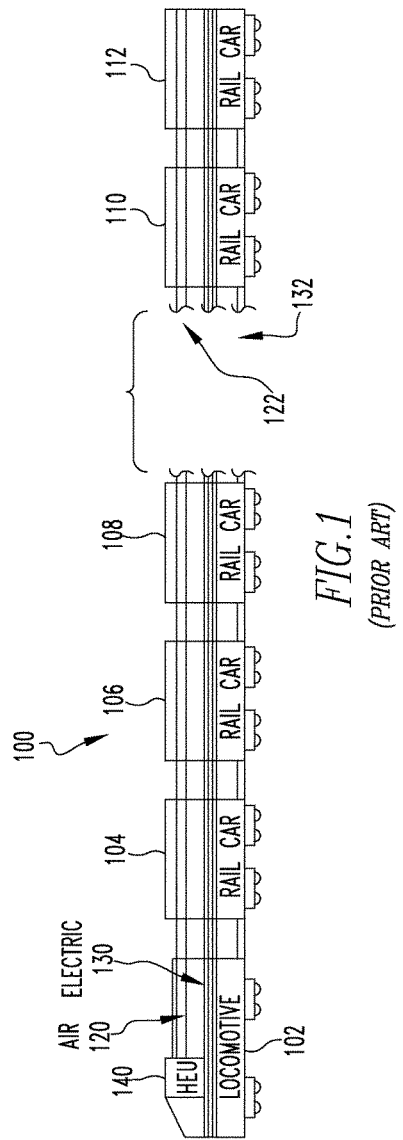
FIG. 1 is a schematic illustration of a train line with ECP controls.

FIG. 1 illustrates an Electronically Controlled Pneumatic (ECP) equipped train line 100 including a locomotive 102, with railcars 104, 106, 108, 110, and 112. Extending the length of the train is bake air pipe 120 and electronic power line 130. A Head End Unit (HEU) 140 is positioned in the locomotive and controls the brake air pipe 120 and electric power line 130.

Figure 2:
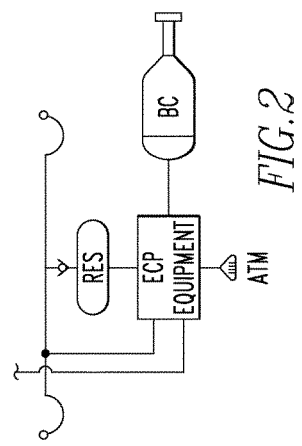
FIG. 2 is a schematic illustration of the brake equipment on board each car in an ECP train line.

FIG. 2 illustrates the basic brake system components on board each ECP car. These components typically include a reservoir (RES) charged with pressurized air from the brake pipe (BP), a pneumatic operated brake cylinder (BC), an exhaust to atmosphere (ATM), and the ECP equipment necessary to implement braking by pressurizing or exhausting the brake cylinder.

Figure 3:
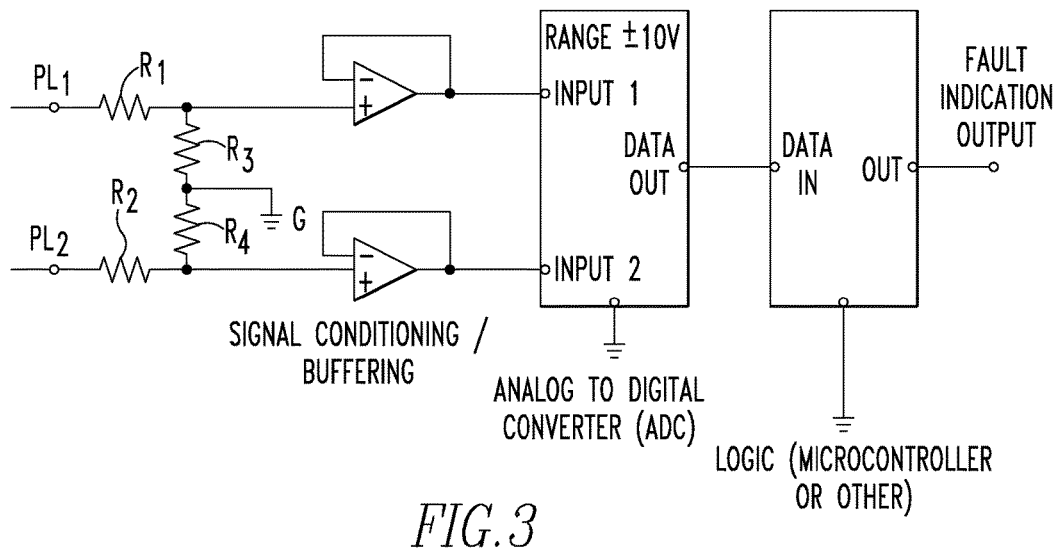
FIG. 3 is the drawing schematically illustrating a circuit for detecting faults in a two-wire electric power line isolated from ground.

Referring now to FIG. 3, a first voltage divider comprising resistors R1 and R3 is connected in series between one conducting line (PL1) of a two-wire electric power cable and ground (G). A second voltage divider comprising resistors R2 and R4 is connected between the other conducting line (PL2) and ground G. In the case of an ECP power line, the ECP power supply uses 230V in normal operation and uses 24V during the start-up phase (the lower voltage is used in what is called the sequencing phase where each vehicle on the train use the 24V to determine its position on the train). The 230V/24V output of the ECP power supply is isolated from ground.

Given the isolated or floating voltage, if the two lines run in a cable of any appreciable length (particularly with a shielded or buried cable), there will be some leakage to ground. This is usually a very high resistance or low leakage on the order of hundreds of Megaohms or even Gigaohms between the conductors and ground. Further, the resistance between each line and ground will be approximately the same. This equal resistance will have the effect of biasing the voltage evenly with respect to ground (earth). In the case of an ECP train line cable at 230V, one conductor will be 115V positive with respect to ground and the other conductor 115V negative with respect to ground.

The voltage dividers present an impedance between each conducting line and ground. This impedance must be maintained the same for each voltage divider. Typically, for an ECP power line, the resistors in each voltage divider provide an impedance of at least 1 Megaohm. In a specific example, the resistors R1 and R2 connected directly to the conductor lines have values of 980 Kilohms and the series resistors R3 and R4 have a resistance of 20 Kilohms. With these specific values, the ratio of input voltage to output voltage of the voltage dividers is close to 50:1. Thus, for the "no fault" condition with 24V applied to the ECP power line, the 24V would divide evenly above and below earth ground potential with minus 12V on one conductor and plus 12V on the other, the output of one voltage divider will be plus 0.24V and the other minus 0.24V balanced in magnitude and within the plus or minus 10V range of analog to digital converter (ADC). For the "no fault" condition with 230V applied to the ECP power line, the input to the analog to digital converter will be plus 2.3V and minus 2.3V, balanced in magnitude and within the input range of the analog to digital converter.

In the case of a "hard fault", for example grounding of the conducting line with the normally negative voltage, the 230V from the power supply will not be evenly divided above and below earth ground potential. The voltage on the normally negative conducting line will be zero and the voltage on the other line will be 230V with respect to earth ground potential. The output from the voltage dividers will thus be zero and 4.6V. The microcontroller (MC) being programmed to compare the inputs from the two voltage dividers will easily recognize a fault condition where a predetermined variance in absolute value exceeds, for example 1V. It can also recognize in which line the fault has occurred by noting the input with less voltage magnitude.

As shown in FIG. 3, op amps (OA1) and (OA2) are placed between the outputs of the voltage dividers and the analog to digital converter. Typically, configured for zero gain the op amps provide high input impedance buffering and signal conditioning between the voltage dividers and the analog to digital converter.

Figure 4:
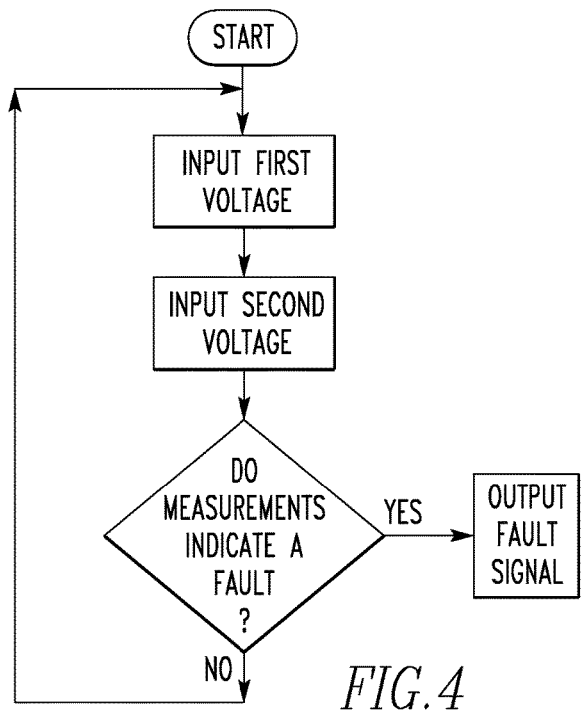
FIG. 4 is a flow diagram describing a program for a microcontroller (MC) in a fault detecting apparatus according to this invention.

Referring to FIG. 4, logic circuit, for example, an MC (microcontroller) is configured and programmed for comparing the digital signals and outputting a fault signal when the absolute values of the digital signals are not within a predetermined or preselected range, for example, 1 volt. Additionally, the MC is programmed to determine if the values of the digital signals input form the analog to digital converter are approximately equal and opposite or the absolute values are within a predetermined or preselected range.

Still further, the logic circuit may be programmed to calculate the approximate impedance of a single fault condition using the following formula: R(fault)=[V(ratio)*R(input)]/[1−V(ratio)], where R(fault) is the impedance of the fault, V(ratio) is the smaller magnitude voltage divided by the larger, R(input) is the input impedance of each input. In the example being described, the R(input) is 1 Megaohm. For example, if the voltage on the positive conductor line is 23V and the voltage on the negative conductor line is minus 207V, the inputs to the analog to digital converter will be plus 0.46V and minus 4.14 volts. Substituting these numbers in the above formula, the fault would be 125,000 ohms.

Having thus defined my invention in the detail and particularity required by the Patent Laws what is protected by Letters Patent is set forth in the following claims.

The invention claimed is:

1. An apparatus for detecting faults in a two-wire electric power line isolated from ground comprising:

two substantially identical high impedance voltage dividers consisting of series resistors, said voltage dividers respectively connected between a different one of the two wires of the power line at one end and the other end to ground, each voltage divider providing a divided analog voltage output at a location between series resistors;

an analog to digital converter having two selectable inputs for converting the divided analog voltages from each voltage divider to digital signals; and a logic circuit for comparing the digital signals and outputting a fault signal when the absolute values of the digital signals are not within a predetermined range.

2. The apparatus for detecting faults according to claim 1, wherein the input impedance of the voltage dividers exceeds one Megaohm.

3. The apparatus for detecting faults according to claim 1, wherein the voltage dividers provide at least a 50:1 reduction between input and output voltages.

4. The apparatus for detecting faults according to claim 1, wherein the preselected range is a preselected percentage of the voltage from one voltage divider.

5. The apparatus for detecting faults according to claim 1, wherein the output voltages of the voltage dividers are conditioned and buffered by op amps.

6. The apparatus for detecting faults according to claim 1, wherein the voltage dividers are each comprised of two resistors with the higher value and lower value resistors being respectively matched in value.

7. The apparatus for detecting faults according to claim 1, wherein the analog to digital converter has an input range of minus ten to plus ten volts.

8. The apparatus for detecting faults according to claim 1, wherein the logic circuit identifies on which of the two wires of the power cable the fault occurs by identifying the input with less voltage magnitude.

9. The apparatus for detecting faults according to claim 1, wherein the logic circuit comprises a microcontroller programmed to determine if the absolute values of the digital signals input from the analog to digital converter are within a preselected range.

10. The apparatus for detecting faults according to claim 1, wherein the logic circuit being programmed to calculate the approximate impedance of an excessive leakage condition using the following formula: R(fault)=[V(ratio)*R(input)]/[1−V(ratio)], where R(fault) is the impedance of the fault, V(ratio) is the smaller magnitude voltage over the larger, R(input) is the input impedance of each input.

11. A method for detecting faults in a two-wire electric power line isolated from ground comprising the steps of:
connecting each of the two wires of the power line respectively to identical high impedance voltage dividers consisting of series resistors, said voltage dividers connected between a different one of the two wires of the electric power line at one end and the other end to ground, each voltage divider providing a divided analog voltage output at a location between series resistors;
with an analog to digital converter having two selectable inputs converting the divided analog voltages from each voltage dividers to digital signals; and
comparing the digital signals and generating a fault signal when the absolute values of the digital signals are not within a preselected range.

12. The method for detecting faults according to claim 11, wherein the input impedance of the voltage dividers exceeds one Megaohm.

13. The method for detecting faults according to claim 11, wherein the voltage dividers provide at least a 50:1 reduction between input and output voltages.

14. The method for detecting faults according to claim 11, wherein the preselected range is a preselected percentage of the voltage from one voltage divider.

15. The method for detecting faults according to claim 11, wherein the outputs voltages of the voltage dividers are conditioned and buffered by op amps.

16. The method for detecting faults according to claim 11, wherein the voltage dividers are each comprised of two resistors with the higher value and lower value resistors being respectively matched in value.

17. The method for detecting faults according to claim 11, wherein the analog to digital converter has an input range of minus ten to plus ten volts.

18. The method for detecting faults according to claim 11, wherein a logic circuit identifies on which of the two wires of the power cable the fault occurs by identifying the input with less voltage magnitude.

19. The method for detecting faults according to claim 11, wherein a logic circuit comprises a microcontroller programmed to determine if the absolute values of the digital signals input from the analog to digital converter are within a preselected range.

20. The method for detecting faults according to claim 11, further comprising calculating the approximate impedance of an excessive leakage condition using the following formula: R(fault)=[V(ratio)*R(input)]/[1−V(ratio)], where R(fault) is the impedance of the fault, V(ratio) is the smaller magnitude voltage divided by the larger, R(input) is the input impedance of each input.

* * * * *